(12) United States Patent
Koshimizu et al.

(10) Patent No.: US 6,426,477 B1
(45) Date of Patent: Jul. 30, 2002

(54) PLASMA PROCESSING METHOD AND APPARATUS FOR ELIMINATING DAMAGES IN A PLASMA PROCESS OF A SUBSTRATE

(75) Inventors: Chishio Koshimizu; Jun Ooyabu, both of Nirasaki; Hideki Takeuchi, Tokyo; Akira Koshiishi, Nirasaki, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/660,194

(22) Filed: Sep. 12, 2000

(30) Foreign Application Priority Data

Sep. 13, 1999 (JP) .......................... 11-259478
Aug. 23, 2000 (JP) ...................... 2000-253033

(51) Int. Cl.$^7$ .............................................. B23K 10/00
(52) U.S. Cl. ............................. 219/121.41; 219/121.43
(58) Field of Search ...................... 219/121.41, 121.4, 219/121.43, 121.54, 121.36; 156/395; 118/723 E, 723 I; 216/67

(56) References Cited

U.S. PATENT DOCUMENTS

| 5,110,437 A | 5/1992 | Yamada et al. |
| 5,314,603 A | 5/1994 | Sugiyama et al. |
| 5,542,559 A | 8/1996 | Kawakami et al. |
| 5,716,534 A | 2/1998 | Tsuchiya et al. |
| 5,900,103 A | * 5/1999 | Tomoyasu et al. ............. 156/345 |
| 6,089,181 A | * 7/2000 | Suemasa et al. ............. 118/723 E |
| 6,106,737 A | * 8/2000 | Tomoyasu et al. ............. 216/67 |
| 6,110,287 A | * 8/2000 | Arai et al. ............. 156/345 |

FOREIGN PATENT DOCUMENTS

| JP | 02297929 A | 10/1990 |
| JP | 8-162293 | 6/1996 |

\* cited by examiner

Primary Examiner—Teresa Walberg
Assistant Examiner—Quang Van
(74) Attorney, Agent, or Firm—Pillsbury Winthrop LLP

(57) ABSTRACT

A plasma processing method includes supplying a low-frequency bias to a first electrode carrying a substrate, and supplying a high-frequency power to a second electrode facing the first electrode, wherein the low-frequency bias is supplied to the first electrode in advance of staring plasma by the energy of the high-frequency power, with an electric power sufficient to form an ion-sheath on a surface of the substrate. A plasma processing apparatus is also provided.

16 Claims, 16 Drawing Sheets

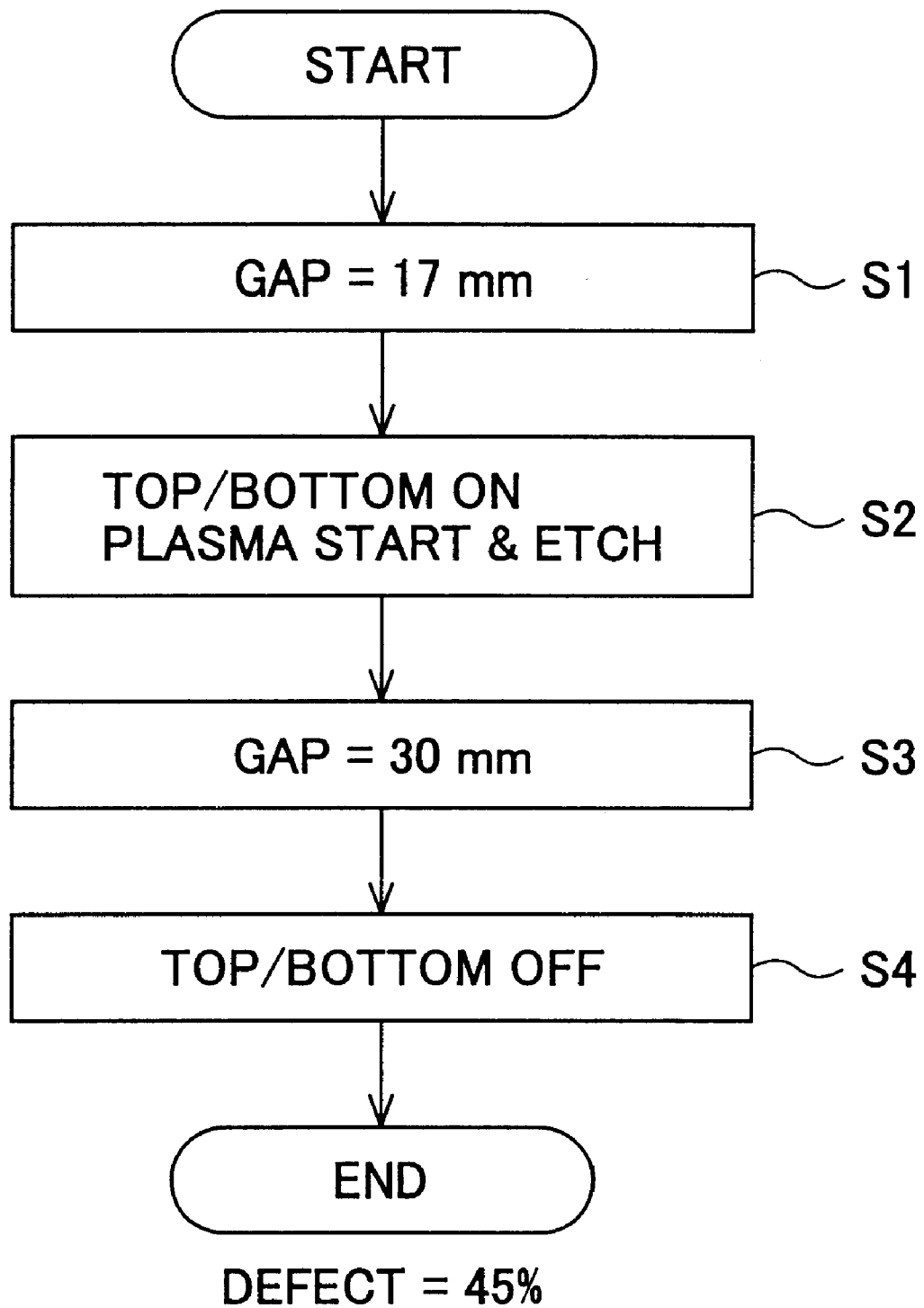

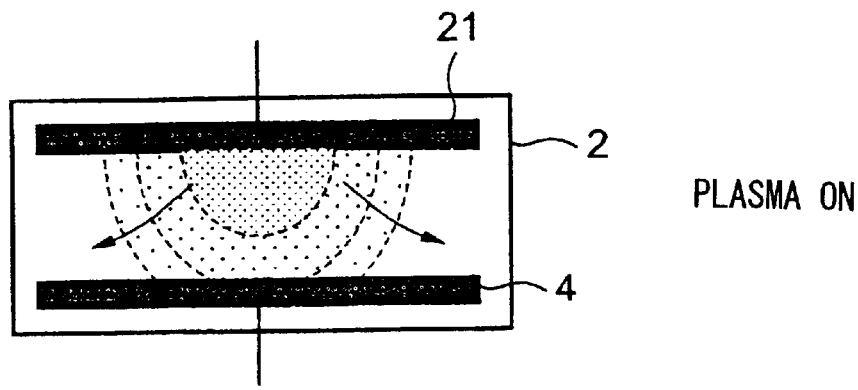
FIG. 10A  PLASMA ON
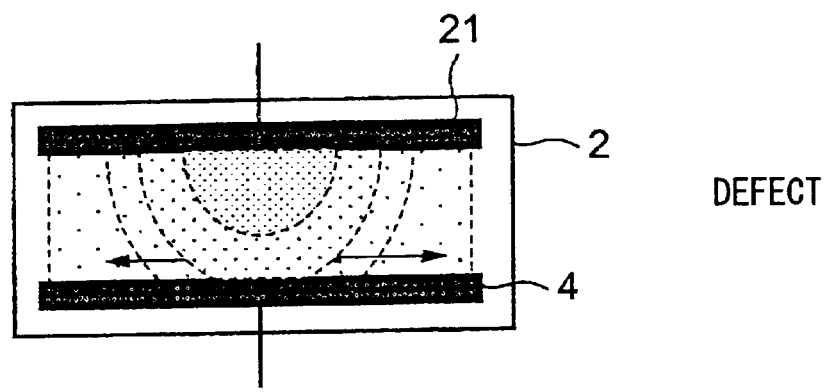
FIG. 10B  DEFECT
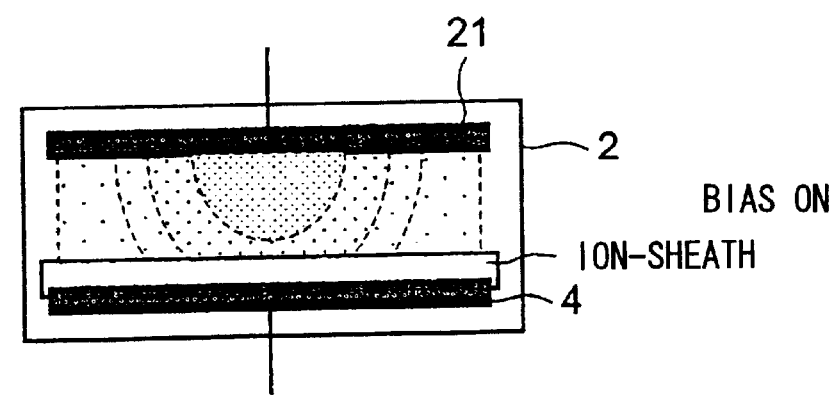
FIG. 10C  BIAS ON
ION-SHEATH

|  |  | PLASMA OFF | | |
|---|---|---|---|---|
|  |  | BOTH off | Top FIRST | Bottom FIRST |
| PLASMA ON | Top FIRST | 40% | | |
| | Bottom FIRST | 100% | 100% | 80% |

PLASMA PROCESSING METHOD AND APPARATUS FOR ELIMINATING DAMAGES IN A PLASMA PROCESS OF A SUBSTRATE

BACKGROUND OF THE INVENTION

The present invention generally relates to the art of plasma processing and more particularly to a plasma processing method and apparatus for eliminating damage in the plasma processing of a substrate.

The art of plasma processing, including plasma-etching process and plasma CVD, is used extensively in the fabrication of various semiconductor devices. Further, plasma processing is also used to produce flat panel display devices such as a liquid crystal display device or a plasma display device.

FIG. 1 shows the construction of a typical conventional plasma-etching apparatus 100 used for etching an insulating film.

Referring to FIG. 1, the parallel-plate plasma-etching apparatus 100 includes a processing chamber 101 in which a lower electrode 102 and an upper electrode 103 are accommodated in parallel relationship. The lower electrode 102 functions as a susceptor and supports thereon a substrate W, while the upper electrode 103 is provided so as to face the lower electrode 102.

The processing chamber 101 is supplied with an etching gas such as a mixture of $C_4F_8$, Ar and $O_2$ and plasma is formed in the processing chamber 101 by supplying high-frequency power of 60 Mhz from a high-frequency source 104 to the upper electrode 103 via an impedance-matching device 105. When a plasma-etching process is carried out on an insulation film formed on the substrate W, a low-frequency bias of 2 MHz is supplied further to the lower electrode 102 from a low-frequency power source 108 via an impedance-matching device 109.

When an a.c. power of low frequency is used for the low-frequency bias, the firing voltage of discharge, above which voltage an electric discharge starts in the processing chamber 101, increases substantially, provided that the pressure inside the processing chamber 101 is held low. Thus, no firing of plasma occurs.

In the case of applying a plasma-etching process to an insulation film formed on the substrate W by using the parallel-plate plasma-etching apparatus 100, it has been practiced to activate the high-frequency power source 104 to start a plasma in the processing chamber 101, and the activation of the low-frequency power source 108 is started thereafter to supply the low-frequency bias to the lower electrode 102. By doing so, it is possible to avoid the problem of sudden impedance change caused in the lower electrode 102 with the firing of the plasma and the associated problem of sudden change of load of the low-frequency power source 108.

Meanwhile, Applicants have discovered, when the conventional parallel-plate plasma etching apparatus such as the apparatus 100 of FIG. 1 is used in the processing of a substrate of advanced, leading-edge semiconductor devices, such as submicron or sub-quarter-micron devices, that the ultrafine semiconductor structures formed on the substrate tend to be damaged as a result of the plasma processing and that a production yield of the semiconductor device is deteriorated.

FIGS. 2A and 2B show the construction of the test piece used in the foregoing experiment conducted by the Applicants.

Referring to FIG. 2A, a Si wafer corresponding to the substrate W of FIG. 1 carries thereon a number of test elements EL, and each of the test elements EL is constructed on a Si substrate 41 corresponding to the Si wafer W as represented in FIG. 2B.

Referring to FIG. 2B, the Si substrate 41 carries thereon a field oxide film 42 defining an active region, while the active region thus defined is covered with a thermal oxide film 43 having a thickness of typically about 5 nm. Further, an electrode pattern 44 of polysilicon is formed on the thermal oxide film 43.

In the experiments, the test elements EL are formed to have an antenna ratio, which is defined as the ratio of the area of the electrode pattern 44 to the area of the thermal oxide film 43, of 260,000, and a plasma-etching process is conducted while setting the separation between the lower electrode 102 and the upper electrode 103 to 19 mm.

According to the experiment, it was discovered that the proportion of the defective test elements EL on the wafer W reaches as much as 35% and that the breakdown voltage of the thermal oxide film 43 is degraded substantially in such defective test elements. Further, it was recognized that the proportion of such defective devices increases when the plasma etching apparatus of FIG. 1 is used for processing ultrafine semiconductor devices.

FIG. 3 shows the proportion of the defective test elements observed in the case the substrate of FIGS. 2A and 2B is subjected to a plasma etching process in the plasma etching apparatus of FIG. 1, wherein the designation "CW" in FIG. 1 indicates a continuous wave, while the designation "58 k," "130 k" and "260 k" represent the antenna ratio.

Referring to FIG. 3, it can be seen that the proportion of the defective elements changes depending on the size of the gap, or gap distance, between the lower electrode 102 and the upper electrode 103. Further, the proportion of the defective elements changes on the antenna ratio. As long as the gap distance is set to a value used commonly in the plasma etching process, occurrence of substantial defects cannot be avoided. The relationship of FIG. 3 also indicates that the proportion of defects increases with increasing antenna ratio when the gap distance between the electrodes 102 and 103 is held constant.

SUMMARY OF THE INVENTION

Accordingly, it is a general object of the present invention to provide a novel and useful plasma processing method and apparatus wherein the foregoing problems are eliminated.

Another and more specific object of the present invention is to provide a plasma processing method and apparatus capable of minimizing the proportion of defective devices formed at the time of the plasma processing.

Another object of the present invention is to provide a plasma processing method conducted in a plasma processing apparatus having a processing chamber, an electrode provided in said processing chamber for supporting a substrate thereon, and a plasma generator provided in said processing chamber, said method comprising the steps of:

(A) supplying a first electric power of a first frequency to said electrode such that said first electric power does not start a plasma in said processing chamber; and (B) supplying a second electric power of a second frequency to said plasma generator such that said second electric power causes said plasma generator to start a plasma in said processing chamber, wherein said step (A) is conducted such that said first electric power is supplied to said electrode prior to said start of said plasma in said step (B) by said plasma generator.

Another object of the present invention is to provide a plasma processing method conducted in a plasma processing apparatus having a processing chamber, an electrode provided in said processing chamber for supporting a substrate thereon, and a plasma generator provided in said processing chamber, said method comprising the steps of:
(A) supplying an a.c. power to said electrode such that said a.c. power does not start a plasma in said processing chamber; and
(B) supplying a microwave power to said plasma generator such that said microwave power causes said plasma generator to start a plasma in said processing chamber,
wherein said step (A) is conducted such that said a.c. power is supplied to said electrode prior to start said plasma in said step (B) by said plasma generator.

Another object of the present invention is to provide a plasma processing method conducted in a plasma processing apparatus having a processing chamber and an electrode provided in said processing chamber for supporting a substrate thereon, said method comprising the steps of:
(A) supplying a first electric power of a first frequency to said electrode such that said first electric power does not start a plasma in said processing chamber; and
(B) supplying a second electric power of a second frequency to said electrode such that said second electric power causes said electrode to start a plasma in said processing chamber,
wherein said step (A) is conducted such that said first electric power is supplied to said electrode prior to said start of said plasma in said step (B) by said electrode.

Another object of the present invention is to provide a plasma processing apparatus, comprising;
a processing chamber;
a first electrode provided in said processing chamber, said first electrode supporting a substrate thereon in said processing chamber;
a second electrode provided in said processing chamber so as to face said first electrode;
a first power source supplying a first electric power of first frequency to said first electrode such that said first electric power does not cause said first electrode to start a plasma in said processing chamber;
a second power source supplying a second electric power of a second, higher frequency to said second electrode such that said second electric power causes said second electrode to start a plasma in said processing chamber,
said first electrode supplying said first electric power to said first electrode prior to starting of said plasma at said second electrode in response to supplying of said second electric power from said second power source.

Another object of the present invention is to provide a plasma processing apparatus, comprising:
a processing chamber;
an electrode provided in said processing chamber, said electrode supporting thereon a substrate in said processing chamber;
a first power source supplying a first electric power of first frequency to said electrode such that said first electric power does not cause said electrode to start a plasma in said processing chamber;
a second power source supplying a second electric power of a second, higher frequency to said second electrode such that said second electric power causes said electrode to start a plasma in said processing chamber,
said first electrode supplying said first electric power to said electrode prior to starting of said plasma at said electrode in response to supplying of said second electric power to said electrode from said second power source.

According to the present invention, it is possible to cover the surface of the electrode carrying the substrate by an ion sheath immediately when a firing of plasma has occurred, by supplying a low-frequency bias, typically 2 MHz or less in frequency, to the foregoing electrode in advance to the firing of the plasma. The low-frequency bias does not cause firing of the plasma, and the ion sheath thus formed effectively protects the electrode and the substrate supported on the substrate from being touched by the plasma. As a result, no charge-up electric current caused by non-uniform charge-up of the substrate flows through the substrate and the damaging of the semiconductor structures on the substrate is successfully eliminated. As long as the low frequency bias is supplied to the electrode with a magnitude sufficient to induce the ion sheath at the time of firing of the plasma, it is possible to choose the timing of supplying of the second electric power arbitrarily with respect to the timing of supplying of the first electric power. For example, the timing of starting the supply of the second electric power to the plasma generator may be earlier or later than the timing of supplying of the low-frequency bias to the electrode, provided that the supplying of the second electric power causes no firing of the plasma until the first electric power reaches a magnitude sufficient for inducing the desired ion sheath on the surface of the electrode. Alternatively, the supply of the second electric power may be started concurrently to the supply of the first electric power, provided that the supply of the second electric power causes no firing of the plasma until the first electric power reaches a sufficient magnitude for inducing the ion sheath on the surface of the electrode.

Another object of the present invention is to provide a plasma processing method conducted in a plasma processing apparatus having a processing chamber, an electrode provided in said processing chamber for carrying a substrate thereon and a plasma generator provided in said processing chamber, said method comprising the steps of:
(A) supplying a first electric power of a first frequency to said electrode
(B) supplying a second electric power of a second frequency to said plasma generator such that said second electric power causes said plasma generator to start a plasma;
(C) turning off a supply of said second electric power to said plasma generator; and
(D) turning off a supply of said first electric power to said electrode,
wherein said step (C) is conducted no later than said step (D).

According to the present invention, it is also possible to eliminate the charge-up current to flow through the substrate at the time of turning off the plasma, by conducting the turning-off of the plasma in the state that the electrode is supplied with the low-frequency bias sufficient to induce an ion sheath. By maintaining the ion sheath at the time of extinguishing the plasma, the problem of non-uniform charge-up of the substrate caused by the shrinking plasma is effectively eliminated.

Other objects and further features of the present invention will become apparent from the following detailed description when read in conjunction with the attached drawings.

BRIEF DESCRIPTION OF THE DRAWINGS

FIG. 6 is a flowchart showing the experiments conducted in the investigation that constitutes the foundation of the present invention;

FIGS. 10A–10C are diagrams explaining the principle of the present invention;

DETAILED DESCRIPTION OF THE PREFERRED EMBODIMENTS

[First Embodiment]

Figure 4:
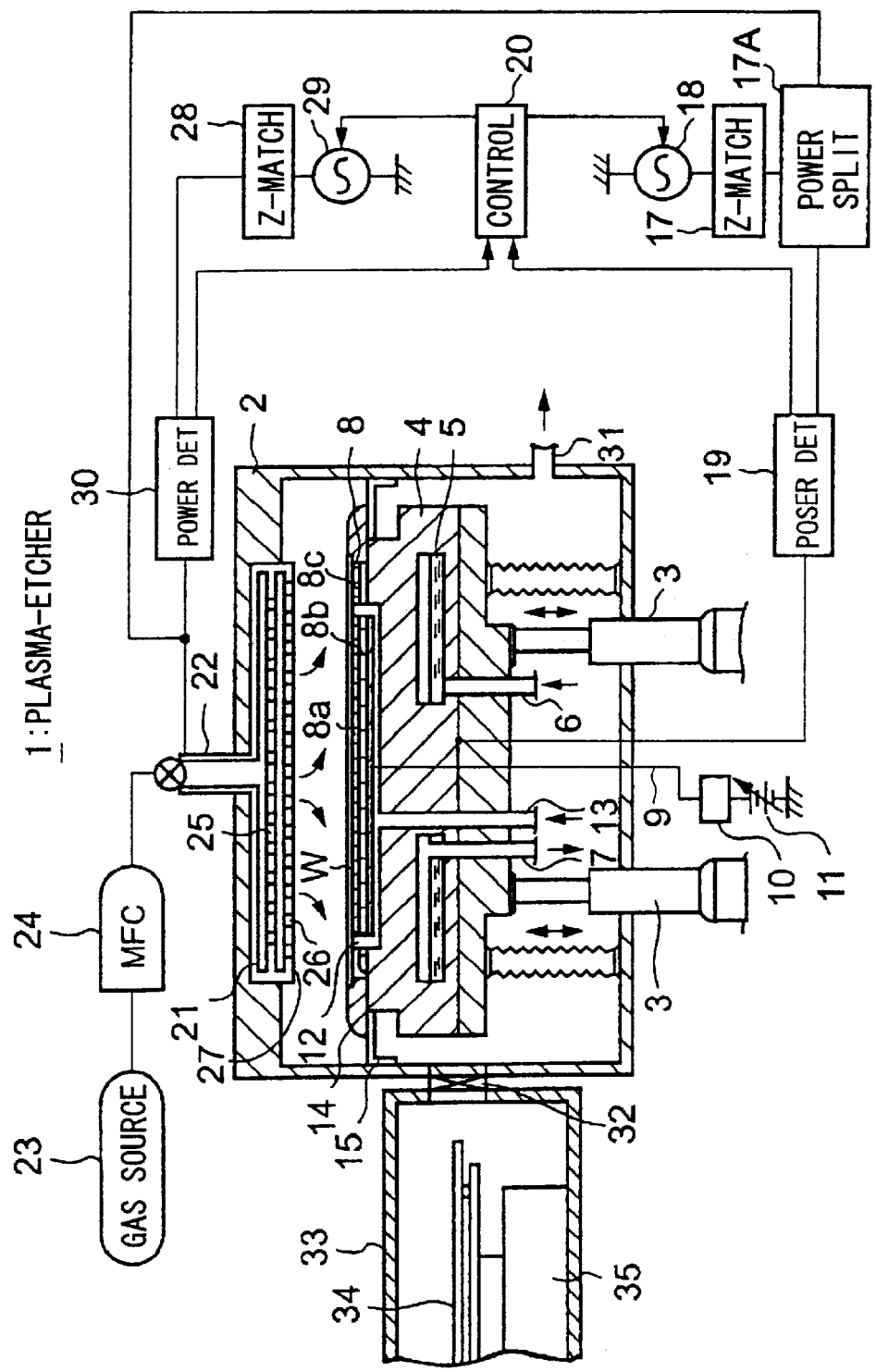
FIG. 4 is a diagram showing the construction of a plasma etching apparatus used in a first embodiment of the present invention.

FIG. 4 shows the construction of a plasma-etching apparatus 1 according to a first embodiment of the present invention.

Referring to FIG. 4, the plasma etching apparatus 1 includes a processing chamber 2 of a conductive material such as Al, and the processing chamber 2 includes therein a stage 4. The stage 4 is provided in the processing chamber 2 movably in a vertical direction by way of an elevating mechanism 3, which may be a motor.

The stage 4 is formed of a plurality of components of Al and the like, and holds a substrate W to be processed. The stage 4 includes a temperature regulator 5 for controlling the temperature of the substrate W held on the stage 4 for processing, wherein the temperature regulator 5 may be a mechanism circulating a heat transfer medium therethrough.

More specifically, a heat transfer medium having a temperature controlled to a predetermined desired temperature by a temperature controller (not shown) is introduced into the temperature regulator 5 through an inlet tube 6, wherein the heat transfer medium thus introduced into the temperature regulator 5 controls the temperature of the substrate W on the stage 4 to the desired substrate temperature. After circulating through the temperature regulator 5, the heat transfer medium is ejected from an ejection tube 7. Of course, it is possible to replace such a temperature regulator 5 by a cooling jacket and a heater provided on the stage 4.

It should be noted that the stage 4 has a circular shape having a central projection and carries thereon an electrostatic chuck 8 having a size typically the size of the substrate W to be processed. The electrostatic chuck 8 may be formed of a pair of spray-coated ceramic insulator layers 8a and 8b sandwiching an electrode 8c of tungsten, wherein the substrate W held on the stage 4 is urged to the ceramic insulator layer 8a by an electrostatic attraction induced in response to application of a high d.c. voltage. Such a high d.c. voltage may be produced by a variable voltage source 11 and supplied to the W electrode 8c via a high-cut filter 10 and a lead line 9. Of course, it is possible to replace the electrostatic chuck 8 by other suitable mechanism such as a mechanical clamp.

In the illustrated example, the electrostatic chuck 8 is formed of a number of concentric structures 12 connected to a gas inlet 13, wherein gas inlet 13 introduces a heat conductive gas such as He to the concentric structures 12 such that the heat conductive gas fills the concentric structures 12 and also any gap existing between the electrostatic chuck 8 and the substrate W. Thereby, the efficiency of heat conduction between the stage 4 and the substrate W is improved significantly.

Around the stage 4, there is provided a focus ring 14 of annular shape so as to surround the substrate W mounted on the electrostatic chuck 8. The focus ring 14 is formed of an insulating or conductive material not attracting reactive ions and performs a function to collect the reactive ions to the region over the substrate W. Further, an exhaust ring 15 having a plurality of baffle apertures is provided so as to surround the stage 4 such that the exhaust ring 15 engages the outer periphery of the focus ring 14. By providing the exhaust ring 15, the flow of the exhaust is conditioned and the processing chamber 2 is evacuated uniformly.

It should be noted that the stage 4 is connected to a low-frequency power source 18 via an impedance matching device 17 that includes a blocking capacitor, wherein the low-frequency power source 18 supplies a low-frequency bias of typically 2 MHz to the stage 4. Between the impedance matching device 17 and the stage 4, there is provided an electric power detector 19, wherein the electric power detector 19 detects the electric power of the foregoing low-frequency bias supplied to the stage 4 and produces an output signal indicative of the result of the electric power detection, wherein the output signal of the electric power detector 19 is supplied to a controller 20 for feedback control of the plasma etching apparatus 1. Thus, it should be noted that the stage 4 functions also as a lower electrode of the parallel-plate plasma etching apparatus that carries the substrate W thereon. It should be noted that the phrase "low-frequency bias" used herein for the electric power produced by the low-frequency power source 18 represents an a.c. bias having a low frequency such that no firing of plasma occurs in the processing chamber 2 even when the low-frequency bias is supplied to the lower electrode 4. It should also be noted that the frequency of the low-frequency bias is by no means limited 2 MHz.

Above the stage 4, there is provided an upper electrode 21 so as to face the stage 4 with a separation of 5–150 mm, wherein the separation between the stage 4 and the upper electrode 21 can be changed as desired by activating the elevating mechanism 3 that supports the stage 4 movably in the vertical direction. The separation may be adjusted as desired depending on the nature or composition of the film to be processed on the substrate W.

To the upper electrode 21, a high-frequency power source 29 is connected via an impedance matching device 28 including a blocking capacitor, and the high-frequency power source 29 supplied a high-frequency power of typically 60 MHz to the upper electrode when the processing apparatus 1 is in operation. In the illustrated example, an electric power detector 30 is interposed between the impedance matching device 28 and the upper electrode 21 and the electric power detector 30 detects the electric power supplied to the upper electrode 21 from the high-frequency power source 29. The electric power detector 30 thereby produces an output signal indicative of the detected electric power and supplies the same to the controller 20 for feedback control of the plasma-etching apparatus 1. In response to the output of the electric power detector 19 and the electric power detector 30, the controller 20 controls the firing and terminating of the plasma in the processing chamber 2.

In the illustrated example, it is constructed that the low-frequency bias of the low-frequency power source 18 is supplied further to the upper electrode 21 via an impedance matching device 17 and a power splitter 17A, wherein a known power splitter may be used for the power splitter 17A.

As will be understood from FIG. 4, the upper electrode 21 includes a hollow part and the hollow part is connected to a process gas line 22, to which a process gas such as a mixture of $C_4F_8$, Ar and $O_2$ is supplied from a gas source 23 via a mass-flow controller 24.

The upper electrode 21 carries, on the surface facing the lower electrode 4, a baffle plate 25 having a number of minute apertures for facilitating uniform diffusion of the process gas and a nozzle plate 27 having a number of minute apertures 26 is disposed further below the baffle plate 25 for introducing the process gas into the processing chamber 2.

Adjacent to the processing chamber 2, there is provided a load-lock chamber 33 connected to the processing chamber 2 by a gate valve 32, and a wafer transport mechanism 35 having a carriage arm 34 is provided in the load-lock chamber 33 for loading and unloading a wafer to and from the processing chamber 2.

Using the plasma-etching apparatus 1 of FIG. 4, the inventor of the present invention has conducted an experimental investigation for the test substrate explained with reference to FIGS. 2A and 2B with regard to the occurrence of damaging associated with the plasma etching process. It should be noted that the relationship of FIG. 3 explained previously is a part of the results of the foregoing experimental investigation of the inventor.

Referring to FIG. 3 again, it is noted that the proportion of the defective test elements decreases with increasing gap distance between the upper electrode 21 and the lower electrode 4. Thus, the inventor of the present invention has obtained a distribution of the etching rate in the wafer surface for various gap distances.

Figure 5A:
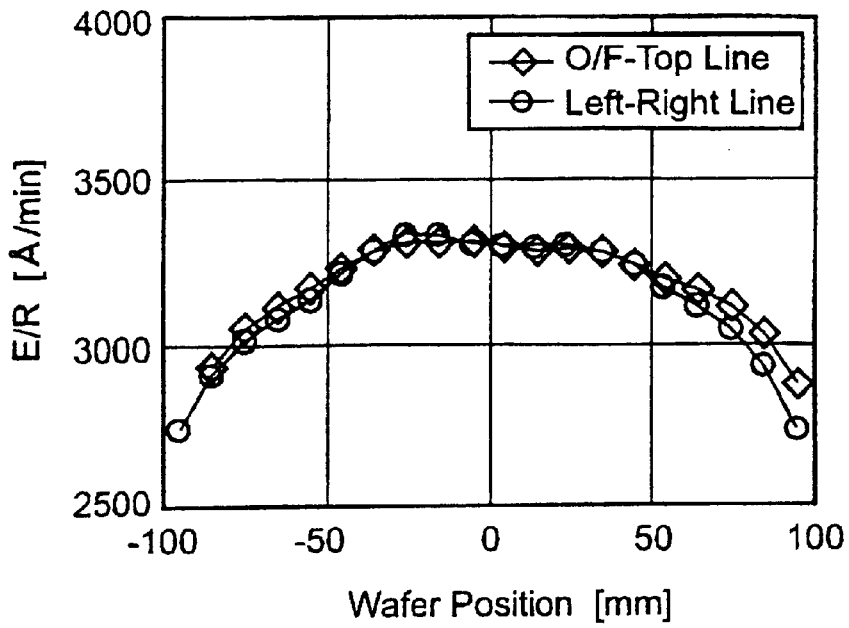
FIGS. 5A and 5B are diagrams showing another relationship discovered in the investigation that constitutes the foundation of the present invention.
Figure 5B:
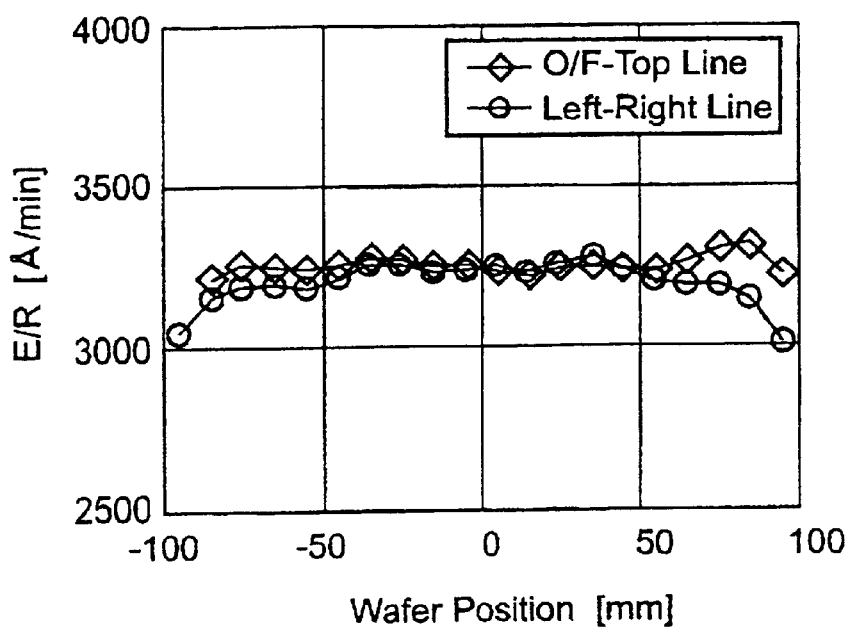

FIGS. 5A and 5B shows the distribution profile of the observed etching rate in the longitudinal direction and in the transverse direction of the wafer for the case in which an $SiO_2$ film on the wafer is etched by using an etching gas of the mixture of $C_4F_8$, Ar and $O_2$, wherein FIG. 5A shows the case in which the gap distance between the upper and lower electrodes is set to 24 mm and FIG. 5B shows the case in which the gap distance is set to 20 mm.

Referring to FIG. 5A, it can be seen that the etching rate is large at the central part of the wafer and small at the marginal part, indicating that the plasma is predominantly acting at the central part of the wafer when the gap distance between the upper and lower electrodes is set to 24 mm. In the case of FIG. 5B in which the gap distance is reduced to 20 mm, on the other hand, it can be seen that a generally uniform etching rate is obtained both at the central part and at the marginal part of the wafer, indicating that the plasma is acting more or less uniformly on the wafer surface.

Further, it was discovered that the proportion of the defective test elements on the wafer is only 5% in the case of FIG. 5A in which the etching rate is non-uniform and that the proportion of the defective test elements increases up to 26% in the case of FIG. 5B that provides the uniform etching rate. The result of this discovery indicates that there should exist a mechanism in the plasma process that causes defects in the devices on the wafer for the case when the plasma acts uniformly over the wafer surface.

Thus, the inventor of the present invention has conducted a further experimental investigation determining whether the defect is caused at the time of starting, or "firing" of the plasma or at the time of terminating, or "extinguishing," of the plasma by using the plasma etching apparatus 1 of FIG. 4.

Figure 7:
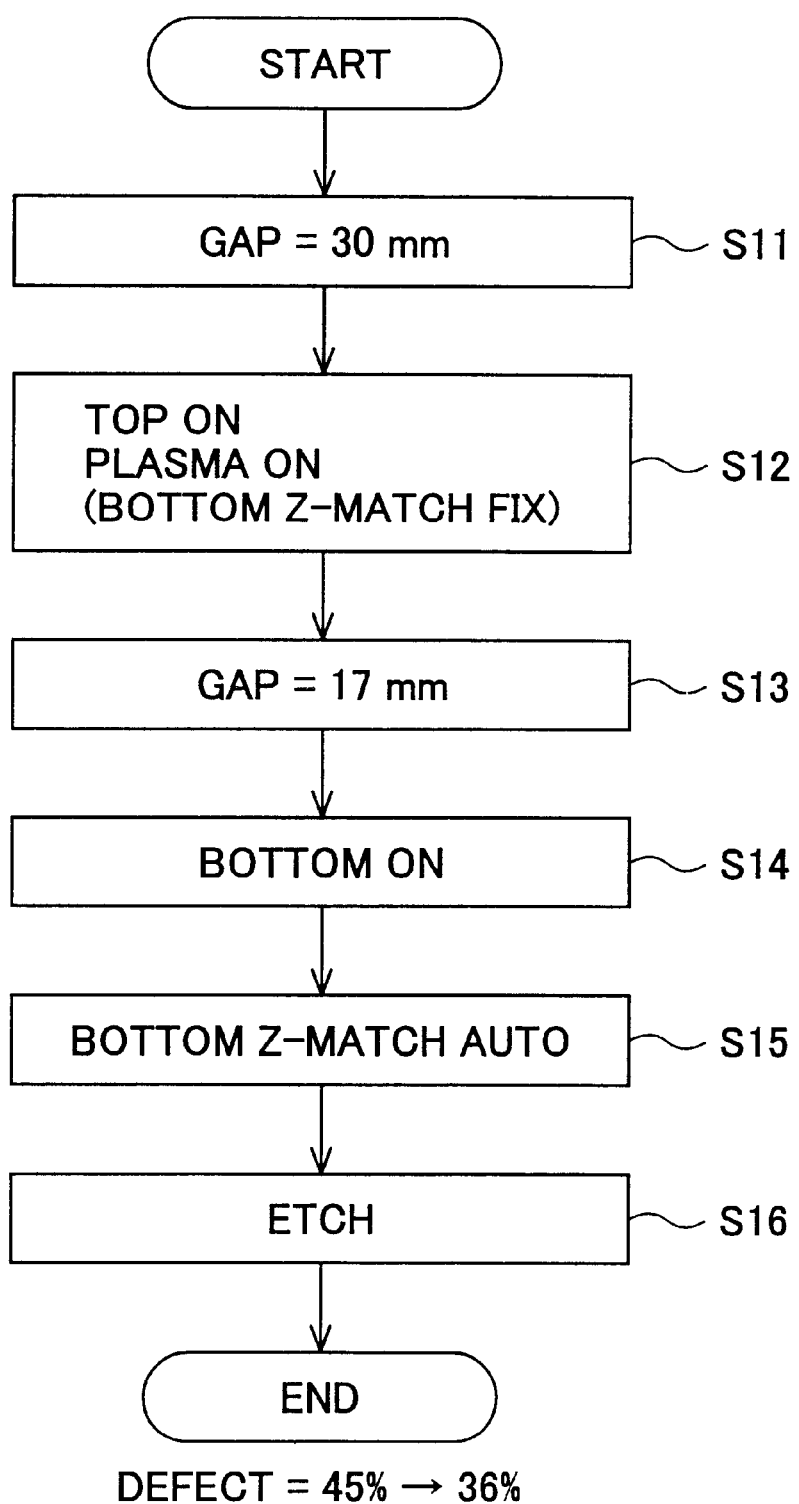
FIG. 7 is a flowchart showing further experiments conducted in the investigation that constitutes the foundation of the present invention.

FIGS. 6 and 7 show the process of the foregoing experiments of the inventor in the form of flowchart, wherein FIG. 6 shows the experiments designed for determining whether or not the defects are caused a the time of extinguishing of the plasma while FIG. 7 shows the experiments designed for determining whether or not the defects are caused at the time of firing of the plasma.

Figure 3:
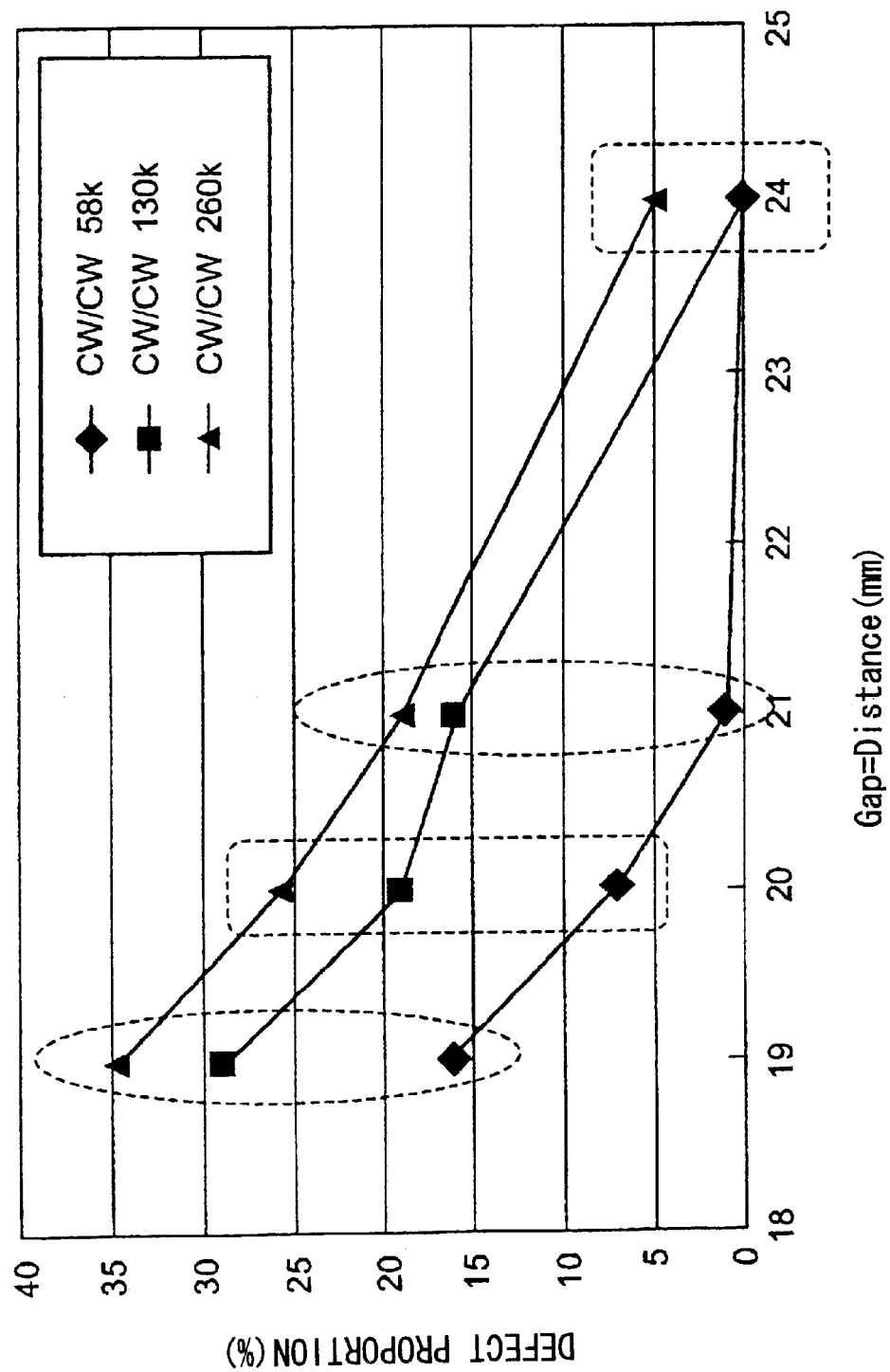
FIG. 3 is a diagram showing the relation. ship discovered in the investigation that constitutes the foundation of the present invention.

As already noted with reference to FIG. 3, it is confirmed that the proportion of the defects becomes small when the gap between the upper and lower electrodes is reduced. Thus, the experiment of FIG. 6 is started with a step S1 in which the electrode gap distance is set to 17 mm, and the plasma is started and the etching started in the subsequent step S2.

After conducting the etching process, the gap distance between the upper and lower electrodes is increased to 30 mm in the step S3 and the plasma is extinguished in the step S4 while maintaining the gap distance to 30 mm.

As represented in FIG. 6, the lower electrode 4 and the upper electrode 21 are supplied respectively with the low-frequency bias and the high-frequency power in the step S2, while the supply of the low-frequency power to the lower electrode 4 and the supply of the high-frequency power to the upper electrode 21 are interrupted simultaneously in the step S4. In the step S2, the plasma is started first by supplying the high-frequency power to the upper electrode 21, and the supply of the low-frequency power to the lower electrode 4 is started 2 seconds after the firing of the plasma. Thus, when it is the case that the defects are formed at the time of the extinguishing of the plasma, it is expected that the proportion of the defects decreases in the process of FIG. 6 in which the plasma is extinguished in the state that the gap distance between the upper and lower electrodes is increased.

Contrary to the foregoing prediction, it was observed that the proportion of the defects of the experiment of FIG. 6 is 45%, indicating that there is no improvement of yield with the process of the experiment of FIG. 6. This result clearly indicates that the observed defects on the substrate W are not caused at the time of extinguishing of the plasma.

Next, the inventor of the present invention has conducted an experiment of FIG. 7 in which the gap distance between the upper and lower electrode is set to 30 mm in the first step S11 and the plasma is started in the step S12 by supplying the high-frequency power to the upper electrode 12. During this process, the impedance matching device 17 for the lower electrode 4 is fixed.

Next, in the step S13, the electrode gap is decreased from 30 mm to 17 mm and the supply of the low-frequency power to the lower electrode 4 is started in the step S14. Further, in the step S15, the impedance matching device 17 is activated for automatic impedance matching, and the plasma etching process is conducted in the step S16.

In the experiment of FIG. 7, it was observed that the initial proportion of the defects of 45% is decreased to the value of 36%. This result suggests that the large gap distance used in the step S12 at the time of firing of the plasma has caused the improvement of the yield, and that the defects on the substrate W are mainly caused at the time of firing of the plasma.

In view of the fact that damage is primarily caused at the time of the firing of the plasma as revealed by the experiments of FIGS. 6 and 7, Applicants have made a further investigation with regard to the effect of timing of the low-frequency bias applied to the lower electrode on the proportion of the defects on the substrate W.

Figure 8:
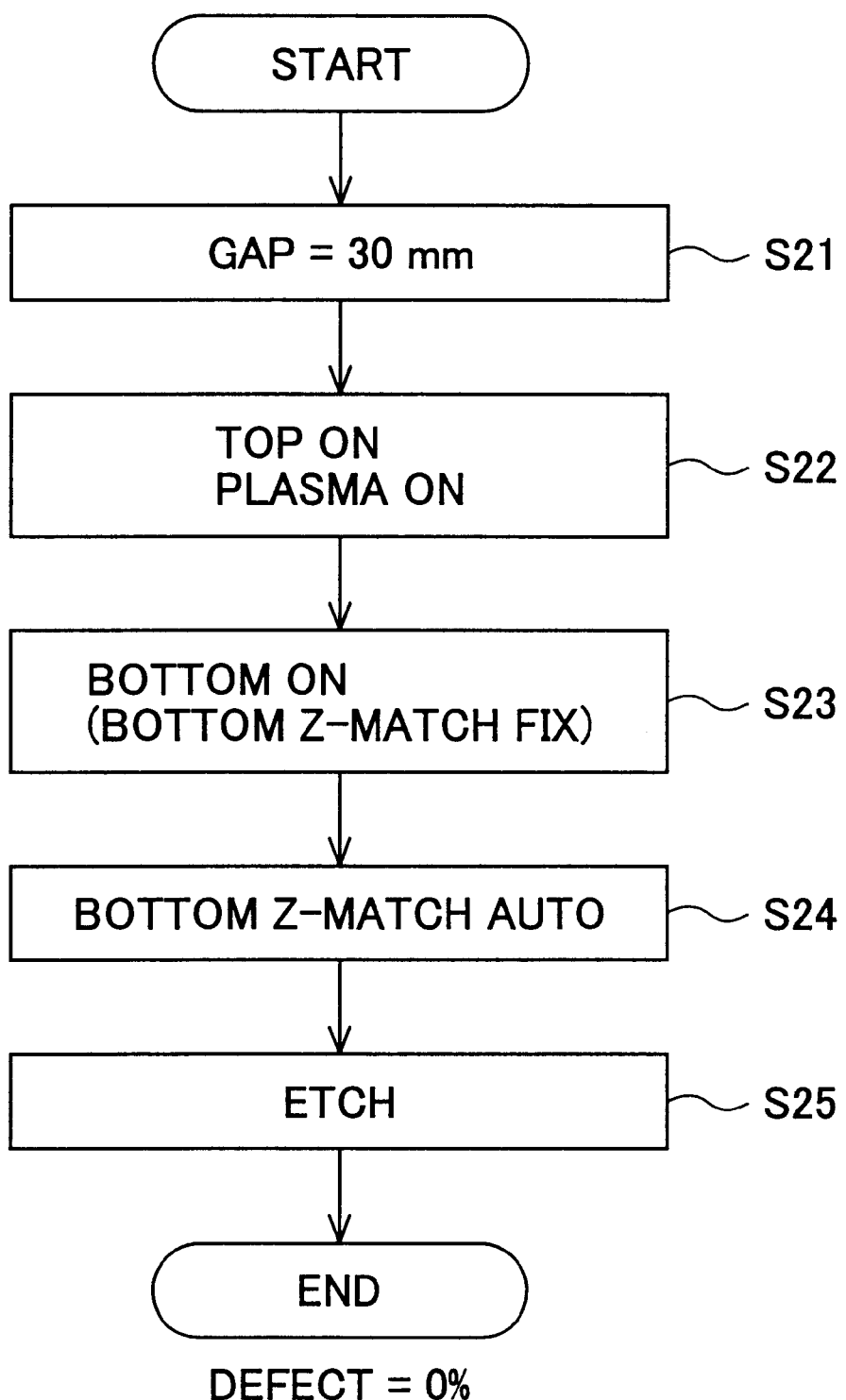
FIG. 8 is a flowchart showing still further experiments conducted in the investigation that constitutes the foundation of the present invention.

FIG. 8 is a flowchart showing the experiments conducted by the inventor of the present invention with regard to the foregoing effect of the timing of the low-frequency bias to the lower electrode 4.

Referring to FIG. 8, the experiment is started with the step S21 in which the gap distance between the upper and lower electrodes is set to 30 mm, and the high-frequency power is applied to the upper electrode 21 in the step S22. Thereby, a plasma is started in the processing chamber 2.

Next, in the step S23, the low-frequency bias is supplied to the lower electrode 4 in the state that the impedance matching device 17 for the lower electrode 4 is fixed. Further, the step S24 is conducted in which the electrode gap distance is reduced to 17 mm, and the impedance matching device 17 for the lower electrode 4 is activated in the step S25 for automatic impedance matching. Further, a plasma etching process is conducted in the step S26.

As a result of the experiment of FIG. 8, it was confirmed that the initial proportion of defects of 45% is reduced to 0%, indicating clearly that the supplying of the low-frequency bias to the lower electrode 4 prior to the decrease of the electrode gap distance for plasma etching is critically important for improving the yield of the plasma etching process.

On the other hand, the process of FIG. 8, which includes the process of decreasing the electrode gap distance while supplying the low-frequency bias to the lower electrode 4, is not practical in the production of semiconductor devices or liquid crystal display devices, as there tends to occur a large reflection of the electric power from the lower electrode 4 to the low-frequency power source 18. When such a reflection of the electric power occurs, there is a substantial risk that the low-frequency power source 18 may be damaged.

Figure 1:
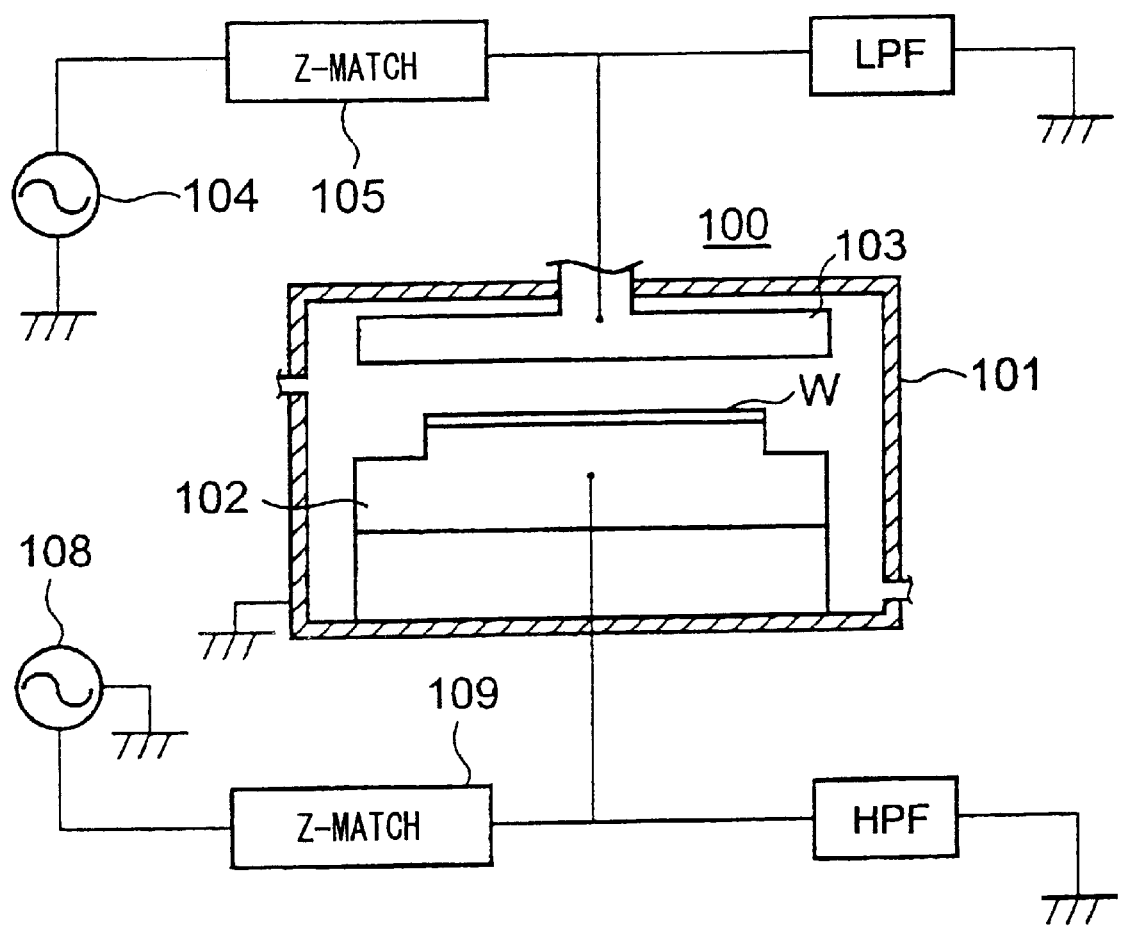
FIG. 1 is a diagram showing the construction of a conventional plasma etching apparatus.

Thus, in view of the result of the experiment of FIG. 8, the present embodiment proposes a process in which the low-frequency bias is supplied to the lower electrode 4 in advance of firing the plasma in the plasma processing apparatus of FIG. 1.

Figure 9:
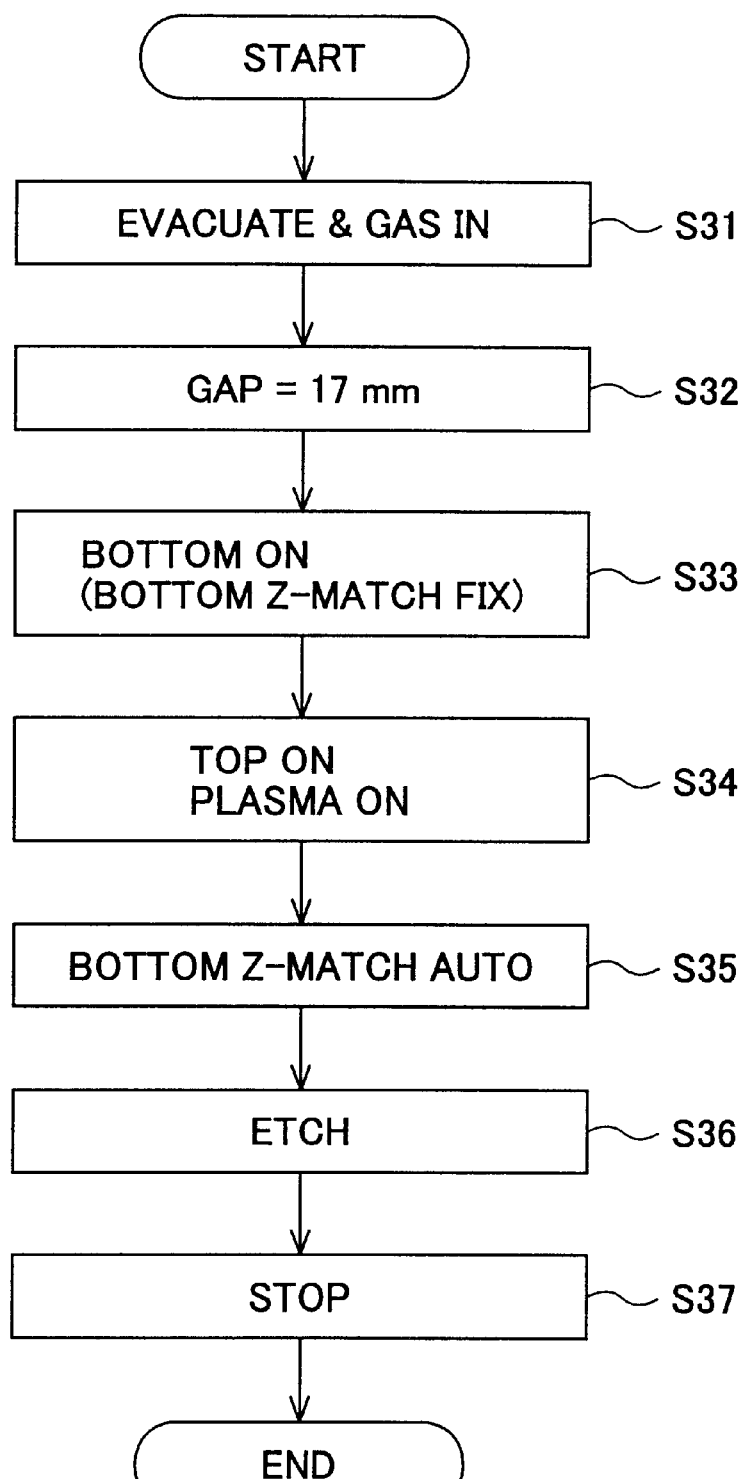
FIG. 9 is a flowchart of a plasma-etching process according to the first embodiment of the present invention.

FIG. 9 shows the plasma processing method according to the present embodiment in the form of flowchart.

Referring to FIG. 9, the processing chamber 2 is evacuated in the step S31 to a pressure of about 20 mTorr and $C_4F_8$, Ar and $O_2$ gases are introduced into the processing chamber 2 with a flow-rate of 12 SCCM, 300 SCCM and 7 SCCM, respectively.

Next, in the step S32, the electrode gap distance is set to a desired value such as 17 mm and the impedance matching device 17 for the lower electrode 4 is set to the state corresponding to the foregoing electrode gap distance of 17 mm. Further, the low-frequency power source 18 is activated and a low-frequency power of 2 MHz is supplied to the lower electrode 4 with an electric power of about 1200 W. In this state, no plasma is formed in the processing chamber 2.

Next, in the step S34, the high-frequency power source 29 is activated and a high-frequency power of 60 MHz is supplied from the high-frequency power source 29 to the upper electrode 21 via the impedance matching device 28 with an electric power of about 1500 W. In response to the supplying of the high-frequency power to the electrode 21, a plasma is started in the processing chamber 2.

Next, in the step 35, the impedance matching device 17 for the lower electrode 4 is activated for automatic impedance matching so as to compensate for the impedance change that is caused in the lower electrode 4 as a result of firing of the plasma. In the step 35, the supply of the low-frequency bias to the lower electrode 4 is continued with the electric power of 1200 W. Thereby, the desired plasma etching of the substrate W is continued in the step S36 over a desired duration.

Next, in the step S37, the high-frequency power source 29 and the low-frequency source 18 are interrupted and the plasma-etching process is terminated. In the step S37, it is preferable to deactivate the high-frequency power source 29 first to extinguish the plasma and then deactivate the low-frequency power source 18. Alternatively, the high-frequency power source 29 and the low-frequency power source 29 may be deactivated simultaneously.

According to the process of FIG. 9, it was confirmed that the proportion of the defective elements is reduced from the initial value of 45% to 0%. It should be noted that the process of FIG. 9 no longer includes the step of changing the electrode gap distance in the state that the plasma is formed between the upper and lower electrodes. In the present embodiment, it should further be noted that the problem of sudden impedance change of the lower electrode 4, caused as a result of the firing of the plasma in the step S34, and the associated problem of damaging of the low-frequency power source 18 caused as a result of such a sudden impedance change, is successfully avoided by fixing the state of the impedance matching device 17 during the process of the step S33.

Figure 11A:
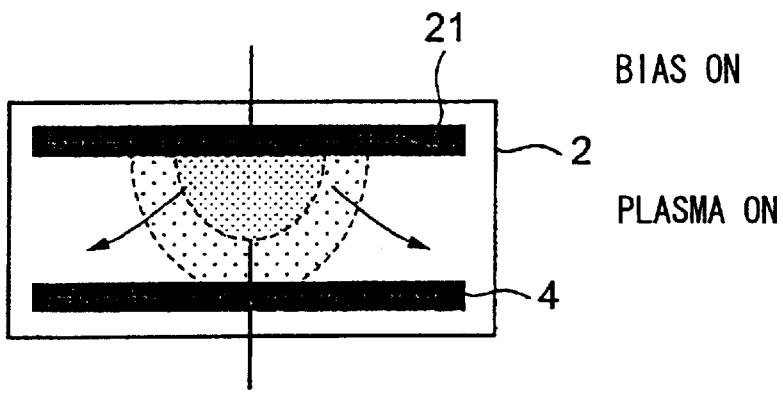
FIGS. 11A–11C are further diagrams explaining the principle of the present invention.
Figure 11B:
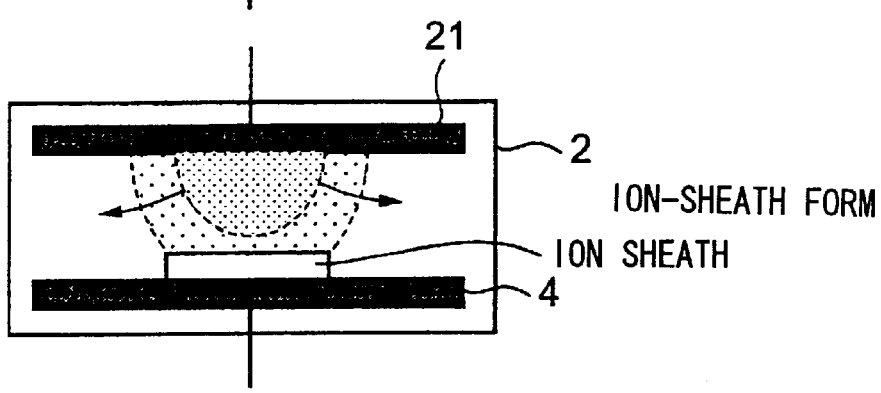
Figure 11C:
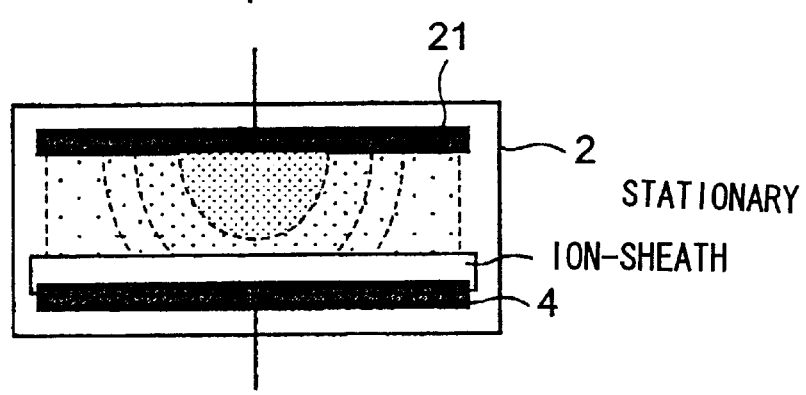

The mechanism of causing the defects in the plasma process of FIGS. 5A and 5B or FIGS. 6 and 7 and also the mechanism that the defect formation is eliminated in the plasma process of FIG. 9 are not fully understood at present. It is thought, however, that there exists a mechanism more or less similar to the mechanism to be described below with reference to FIGS. 10A–10C and FIGS. 11A–11C, wherein FIGS. 10A–10C represents the mechanism of causing the defects while FIGS. 11A–11C represents the mechanism of eliminating the defects. In FIGS. 10A–10C and FIGS. 11A–11C, those parts corresponding to the parts described previously are designated by the same reference numerals and the description thereof will be omitted.

Referring to FIG. 10A showing the state in which the upper electrode 21 is supplied with the high-frequency power while no low-frequency power is supplied to the lower electrode 4, there is caused a firing of the plasma in response to the supplying of the high-frequency power to the electrode 21, and the plasma region thus formed spreads toward the lower electrode 4 as represented in FIG. 10A by arrows. In the state of FIG. 10A, it can be seen that the central part of the plasma region has just reached the lower electrode 4.

FIG. 10B shows the state in which the plasma has been stabilized in the processing chamber 2, wherein it can be seen in FIG. 10B that the plasma region is formed on the substantially entire surface region of the lower electrode 4.

Further, FIG. 10C shows the state in which the low-frequency bias is supplied to the lower electrode 4. As the low-frequency bias has a sufficiently low frequency that allows the ions in the plasma to follow the electric field of the low-frequency bias, there is formed a local balance of negatively charged electrons and positively charged ions on the surface of the lower electrode 4 as the lower electrode 4 changes the polarity thereof repeatedly between the positive polarity and the negative polarity. As a result of such a local balance of the electrons and the ions, there is formed a region called ion-sheath on the surface of the lower electrode 4 such that no plasma exists in the ion-sheath. The ion-sheath extends along the surface of the lower electrode 4 so as to cover the substrate provided on the lower electrode 4, and the plasma-etching process of the substrate is conducted in the state of FIG. 10C.

In the conventional plasma etching process of FIGS. 10A–10C, the state of FIG. 10B continues for several seconds so as to stabilize the plasma, wherein it should be noted that there exists a generally concentric density profile of plasma in the plasma region. Thus, in the state of FIG. 10B, the central part of the substrate is exposed to a high-density plasma, while the marginal part of the substrate is exposed to a low-density plasma. Because of the difference in the plasma density, there flows a current in the substrate as represented in FIG. 10B by arrows, and it is thought that it is this current that causes the defects in the device elements formed on the substrate.

The foregoing interpretation is supported by the result of the experiment represented in FIG. 5A. When the state of FIG. 10A is realized as a stationary state, it is expected, from the foregoing mechanism, that the proportion of the defects on the substrate is small in view of the large gap distance between the upper and lower electrodes. Further, it is expected that the etching rate is decreased at the marginal part of the substrate. This prediction fits well with the result of FIG. 5A.

In the case of the plasma-etching process of the present embodiment represented in FIG. 9, the lower electrode 4 is already supplied with the low-frequency bias when the plasma is started in the step of FIG. 11A. Thus, whenever the plasma region reaches the lower electrode 4, the ion-sheath is formed instantaneously on the lower electrode 4.

Thus, when the plasma region spreads along the lower electrode 4 in the state that the ion-sheath is formed on the surface of the lower electrode 4, the ion-sheath spreads also in the lateral direction together with the plasma. Thereby, the plasma does not make a direct contact with the lower electrode 4 and hence the substrate held on the lower electrode 4, and the problem of the current flowing over the substrate as a result of the plasma density profile causes a damage in the device elements on the substrate is eliminated.

Thus, the present embodiment effectively decreases the formation the defective elements on the substrate formed as a result of the plasma-etching process to substantially 0%, by supplying a low-frequency bias to the lower electrode 4 prior to firing of the plasma in the processing chamber 2 in response to supplying of the high-frequency power to the upper electrode 21, with a frequency chosen not to cause firing of plasma and with an electric power set such that the ion-sheath is formed around the substrate on the lower electrode 4 when the firing of the plasma has occurred as represented in FIG. 11B.

As long as the necessary low-frequency bias is supplied to the lower electrode 4 in advance to the firing of the plasma, it is possible to choose the timing of starting the supply of the low-frequency bias and the timing of starting the supply of the high-frequency power arbitrarily. FIGS. 12A–12D show some of the typical examples.

Figure 12A:
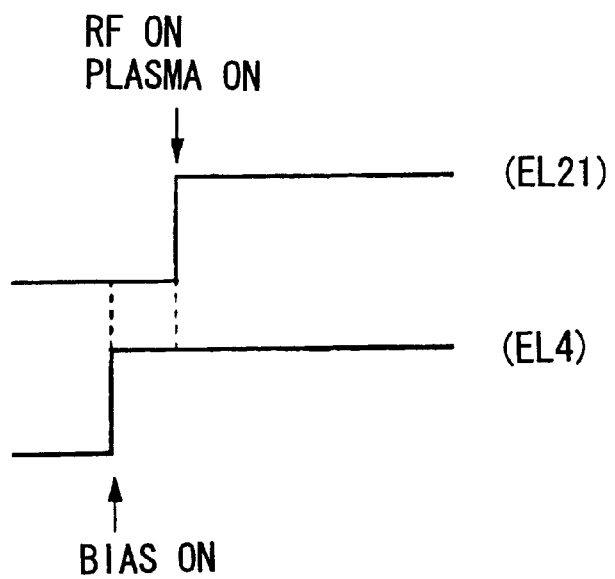
FIGS. 12A–12D are diagrams showing the timing of high-frequency power and low-frequency power.

Referring to FIG. 12A, it can be seen that the high-frequency power and the low-frequency bias rises sharply in response to turning-on of the high-frequency power source 29 and the low-frequency power source 18 and the firing of the plasma occurs substantially simultaneously to the turning-on of the high-frequency power source 29. When the output power rises sharply with the turning-on of the high-frequency power source 29 and the low-frequency power source 18 as in the case of FIG. 12A, it is necessary to set the timing of the turning-on of the low-frequency power source 18 such that the turning-on of the low-frequency power occurs in advance to the turning-on of the high-frequency power source 29.

Figure 12B:
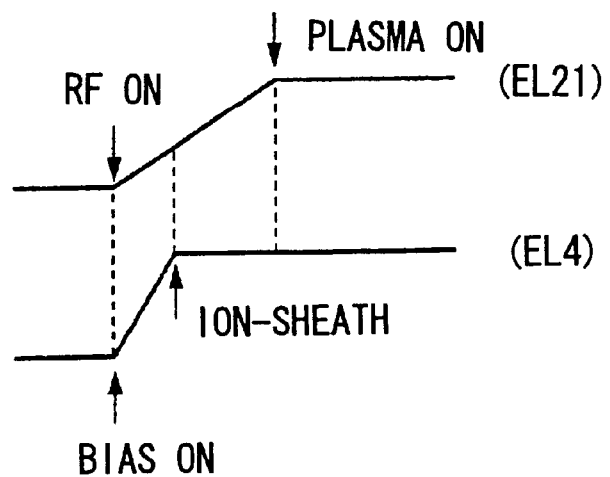
Figure 12C:
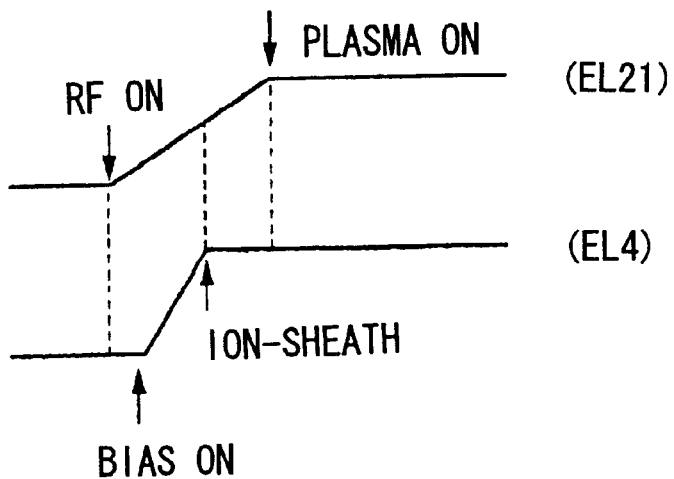

In the example of FIGS. 12B and 12C, it is noted that the low-frequency bias of the low-frequency power source 18 rises sharply in response to the turning-on of the low-frequency power source 18, while the high-frequency output power of the high-frequency power source 29 rises only gradually. In such a case, it is possible to supply a low-frequency power sufficient to form the ion-sheath to the lower electrode 4 in advance to the firing of the plasma even when the low-frequency power source 18 and the high-frequency power source 29 are turned on simultaneously as represented in FIG. 12B or when the high-frequency power source 29 is turned on prior to the low-frequency power source 18.

Figure 12D:
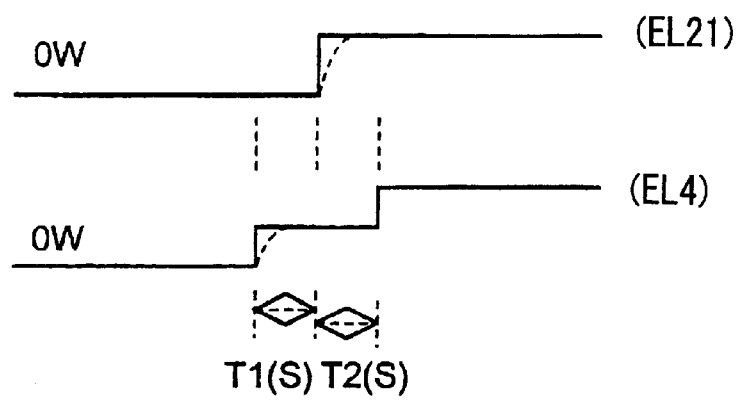

Further, FIG. 12D shows the case in which the low-frequency power source 18 is activated first to supply a low-frequency bias to the lower electrode 4 with a power P1 sufficient to form the desired ion-sheath on the electrode 4 but smaller than the nominal power P2 prescribed by the recipe of the plasma-etching process. Next, the high-frequency power source 29 is turned on and the high-frequency power is supplied to the upper electrode 21. Thereby, firing of plasma is caused at the upper electrode 21. Next, the low-frequency power source 18 is controlled and the electric power of the low-frequency bias is set to the foregoing prescribed electric power P2.

In the case of FIG. 12D, too, it is not necessary to increase the electric power of the low-frequency bias sharply as long as the electric power reaches the value P1 at the time when the firing of the plasma is to be carried out. Thus, it is possible to increase the electric power of the low-frequency bias gradually as represented in FIG. 12D by a broken line. Further, the electric power of the high-frequency power may also be increased gradually as represented in FIG. 12D by a broken line.

In the plasma-etching apparatus of the present embodiment, it is possible to use a high-frequency power source producing a high-frequency output power of 27 MHz for the high-frequency power source 29. Further, the low-frequency power 18 may be an apparatus that produces a low-frequency bias of 800 kHz. Further, it is possible to use a microwave power source for the high-frequency power source 29.

It should be noted that any electric power source that produces an output electric power with a frequency that does not cause firing of the plasma can be used for the low-frequency power source 18. Thus, it is possible to use a high-frequency power source that produces an output power of 13.56 MHz for the low-frequency power source 18, provided that the plasma-etching apparatus 1 is operated under the condition in which no plasma is started with the frequency of 13.56 MHz.

[Second Embodiment]

Figure 13:
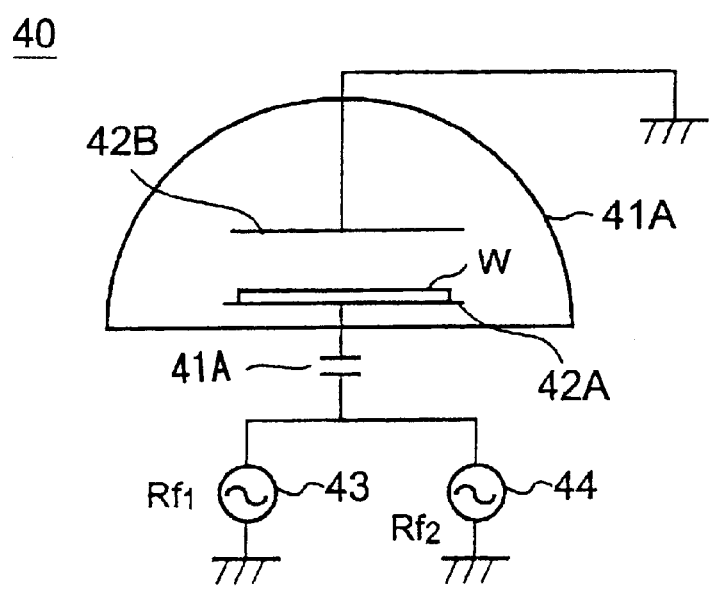
FIG. 13 is a diagram showing the construction of a plasma-etching apparatus according to a second embodiment of the present invention.

FIG. 13 shows the construction of a plasma-etching apparatus 40 according to a second embodiment of the present invention.

Referring to FIG. 13, the plasma-etching apparatus 40 includes a processing chamber 41 accommodating therein a pair of parallel plate electrodes 42A and 42B, wherein the electrode 42A supports a substrate W to be processed in the processing chamber 41. The opposing electrode 42B is grounded. In FIG. 13, it should be noted that the illustration of evacuation system and gas system is omitted for the sake of simplicity.

In operation, the processing chamber 41 is evacuated and an etching gas is introduced into the reaction chamber 41. Further, a bias electric power is produced with a frequency Rf1 of 3.2 MHz by activating a bias power source 43, and the bias electric power thus produced is supplied to the lower electrode 42A via a blocking capacitor 41A.

Next, a high-frequency power source 44 connected to the electrode 42A via the blocking capacitor 41A is activated and a high-frequency power of a frequency Rf2 of 27 or 40 MHz is supplied to the electrode 42A. In response to the supplying of the high-frequency power, there occurs a starting of plasma in the processing chamber 41 and the substrate W held on the electrode 42A is subjected to the plasma-etching process.

In the present embodiment, no external magnetic field is formed in the processing chamber 41 when the plasma-etching process 40 is operated, and thus, no plasma firing occurs when the foregoing bias electric power alone is supplied to the electrode 42A. Only when the high-frequency power of the frequency Rf2 is supplied, there occurs a firing of plasma at the central part of the electrode 42A, and the plasma region thus formed spreads laterally along the surface of the electrode 42A toward the marginal part thereof. As the bias electric power is already supplied to the electrode 42A when such a firing of the plasma occurs, an ion-sheath similar to the one explained with reference to FIG. 11B is formed on the surface of the electrode 42A instantaneously with the plasma firing, and the ion-sheath thus formed spreads laterally with the spreading of the plasma region. Thereby, the substrate W is not exposed to the plasma, and the problem of defect formation associated with the non-uniform charge-up of the substrate is effectively avoided.

[Third Embodiment]

Figure 14:
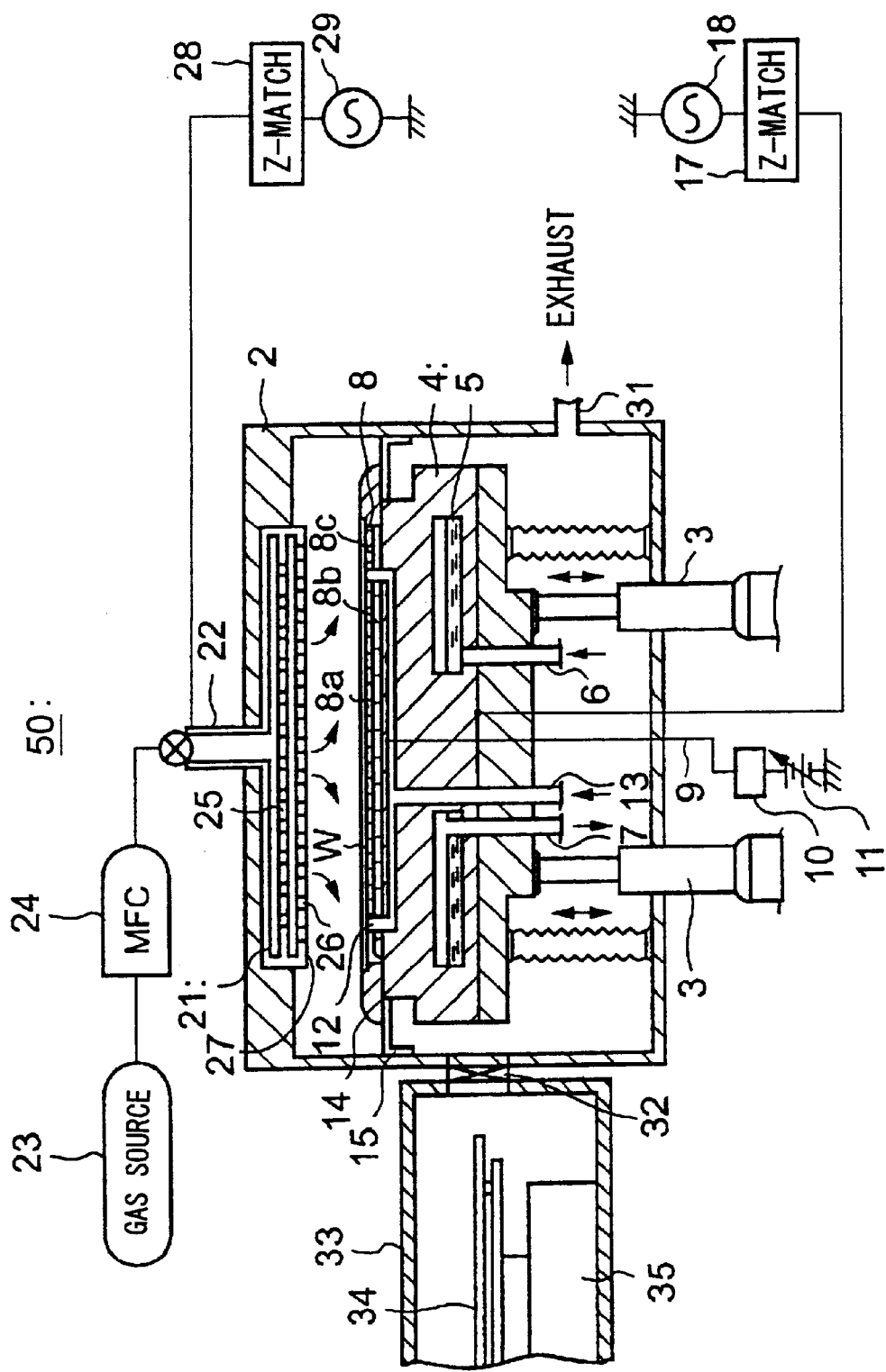
FIG. 14 is a diagram showing the construction of a plasma-etching apparatus according to a third embodiment of the present invention.

FIG. 14 shows the construction of a plasma-etching apparatus 50 according to a third embodiment of the present invention, wherein those parts corresponding to the parts described previously are designated by the same reference numerals and the description thereof will be omitted.

Referring to FIG. 14, the plasma-etching apparatus 50 has a construction similar to the plasma-etching apparatus 1 of FIG. 4 except that the high-frequency power of the high-frequency power source is supplied to the upper electrode 21 directly from the impedance matching device 28 and that the bias power of the low-frequency power source 18 is supplied directly to the lower electrode 4 from the impedance matching device 17.

Figure 15:
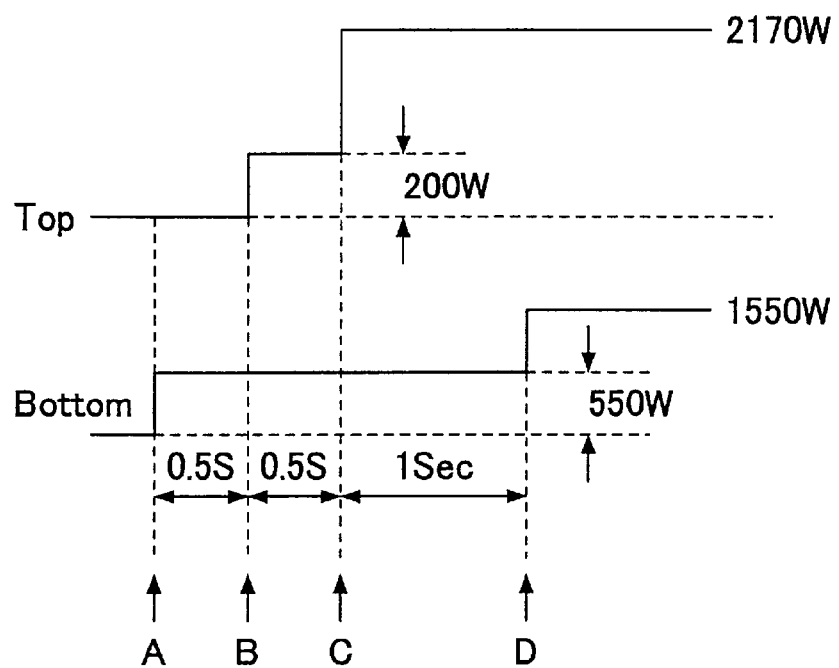
FIG. 15 is a diagram showing the timing of plasma firing conducted in the plasma-etching apparatus of FIG. 14.

TABLE I below represents a typical processing condition used in the plasma processing apparatus 50 of FIG. 14 while FIG. 15 shows the process sequence employed at the time of plasma firing I the plasma-processing apparatus 50 of FIG. 14 according to a third embodiment of the present invention.

TABLE I

|  | Initial RF power | Final RF power |
| --- | --- | --- |
| High Freq. RF | 50–1000 W | 1000–2500 W |
| Low Freq. RF | 200–1000 W | 1000–2000 W |
| $C_xF_y$ ($C_4F_8$, $C_4F_6$, $C_5F_8$) | 10–25 sccm | |
| Ar | 100–600 sccm | |
| $O_2$ | 10–25 sccm | |
| process pressure | 1.33–5.62 Pa (10–40 mTorr) | |
| electrode gap | 21–45 mm | |

Referring to TABLE I, the internal pressure of the processing chamber 2 is set to 1.33–5.62 Pa and the gap distance between the upper electrode 21 and the lower electrode 4 is set to 21–45 mm. The processing chamber 2 is supplied with a CxFy gas, which may be any of a $C_4F_8$, $C_4F_6$ or $C_5F_8$ gas, an Ar gas and an $O_2$ gas, with respective flow-rates of 10–25 sccm, 100–600 sccm and 10–25 sccm.

As will be explained below with reference to FIG. 15, plasma-etching of an oxide film is conducted by changing the electric power of the low-frequency bias of 2 MHz supplied from the low-frequency power source 18 to the lower electrode 4 stepwise from a first value of 200–1000 W to a second value of 1000–2000 W and further by changing the high-frequency power of 60 MHz supplied from the high-frequency power source 29 to the upper electrode 21 stepwise from a first value of 50–1000 W to a second value of 1000–2500 W.

Referring to FIG. 15, the low-frequency power source 18 is activated with a timing A and the low-frequency bias of 2 MHz is supplied to the lower electrode 4 with an electric power of 200–1000 W, such as 550 W. With a delay of 0.1–1 second, typically with a delay of 0.5 seconds from the timing A, the high-frequency power source 29 is activated with a timing B and the high-frequency power of 60 MHz is supplied to the upper electrode 21 with an electric power of 50–1000 W, such as 200 W. At the timing B, it should be noted that the plasma is started in the processing chamber 2, wherein the substrate W is covered with an ion-sheath when the plasma is started in view of the fact that the lower electrode 4 is already supplied with the low-frequency bias with a substantial power.

Next, with a timing C delayed from the timing B by 0.1–1 second, typically 0.5 seconds, the plasma power to the upper electrode 21 is increased to 1000–2500 W, and the electric power of the low-frequency bias is increased to 1000–2000 W with a timing D, which is 0.1–1 second later than the timing C. Typically, the timing D is 0.5 seconds later from the timing C. With the high-frequency power and the low-frequency bias set as such, the desired plasma-etching of the insulation film is conducted in the plasma-processing apparatus 50.

Figure 16:
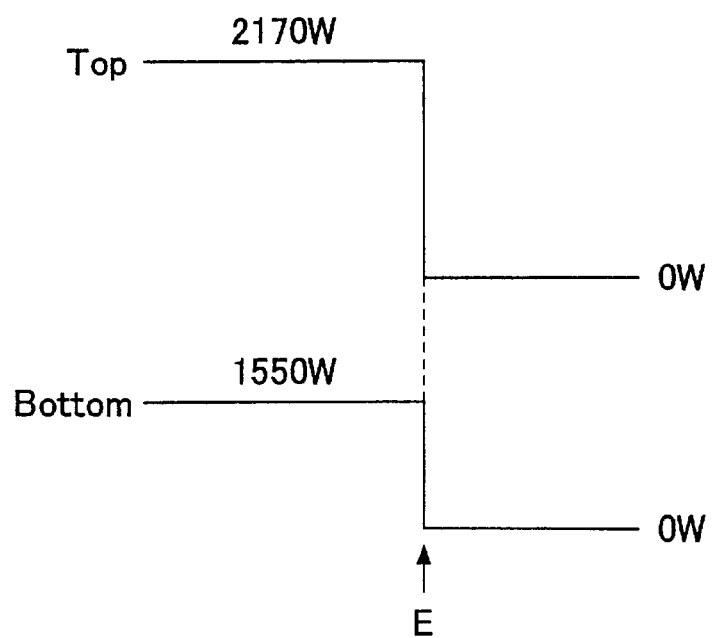
FIG. 16 is a diagram showing the timing of terminating a plasma conducted in the plasma-etching apparatus of FIG. 14.
Figures 17, 18:
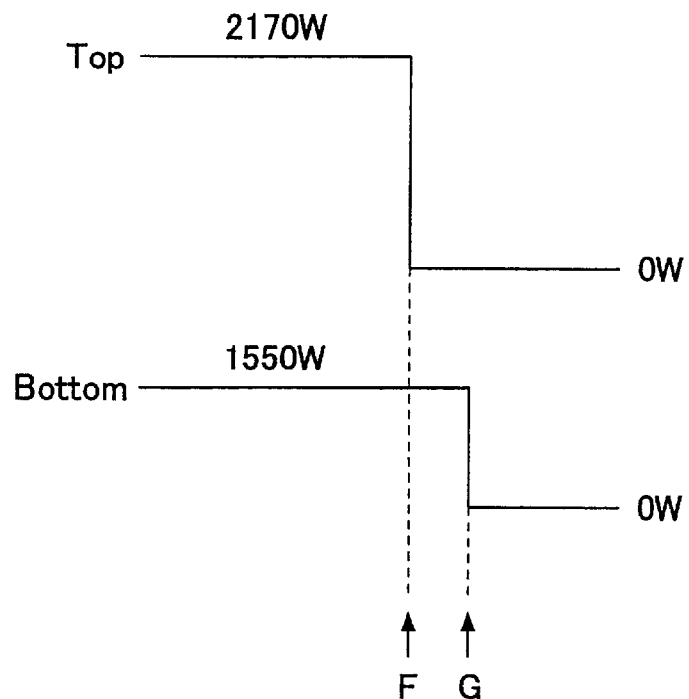
FIG. 17 is a diagram showing another example of the timing of terminating a plasma conducted in the plasma-etching apparatus of FIG. 14.
FIG. 18 is a diagram showing the yield of the plasma-etching process conducted by the apparatus of FIG. 14 for various plasma firing and terminating sequences.

FIGS. 16 and 17 show the process of terminating the plasma-etching step following to the plasma-etching process of FIG. 15.

Referring to FIGS. 16 and 17, it will be noted that FIG. 16 shows the case in which the high-frequency power to the upper electrode 21 and the low-frequency bias to the lower electrode 4 are turned off simultaneously when terminating the plasma-etching process. FIG. 17, on the other hand, represents the case in which the high-frequency power is turned off with a timing F, and the low-frequency power is turned off thereafter, with a timing G.

In the terminating step of the plasma etching process of FIG. 16 or FIG. 17, it should be noted that the surface of the substrate W is covered with the ion-sheath caused by the low-frequency bias power, as long as there exists plasma in the processing chamber 2. Thus, even when the plasma undergoes shrinking and annihilation in response to the turning off of the high-frequency power, the substrate is protected from the charge-up current that is caused by the non-uniform charge-up of the substrate and the formation of the defects is effectively suppressed.

Figure 2A:
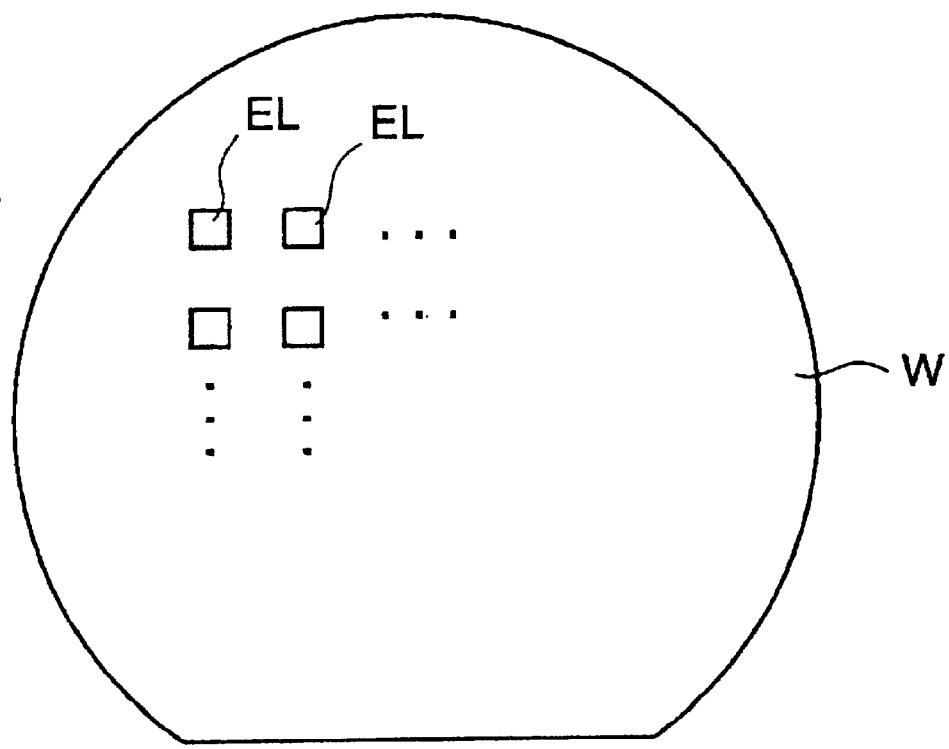
FIGS. 2A and 2B are diagrams showing the construction of a test substrate used in an investigation that constitutes the foundation of the present invention.
Figure 2B:
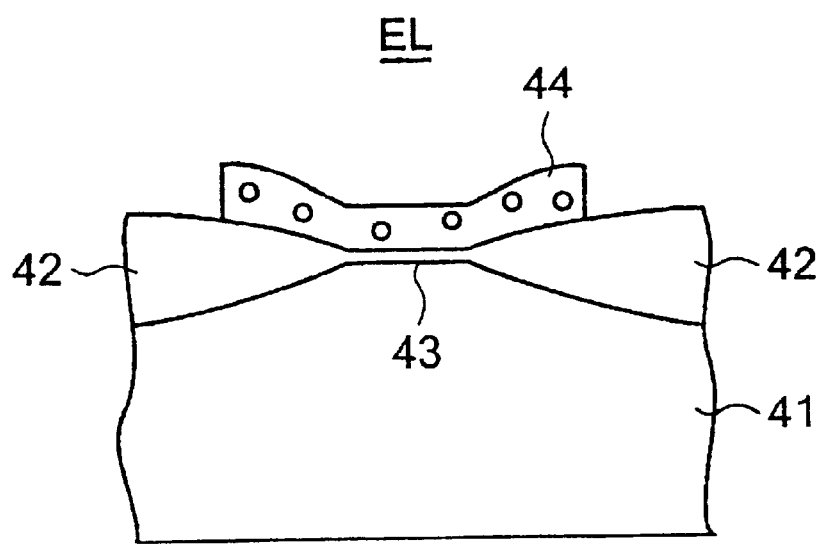

FIG. 18 summarizes the yield achieved in the case the test elements EL of FIGS. 2A and 2B are subjected to a plasma-etching process while using various process sequences including those shown in FIGS. 15–17. In the experiments of FIG. 18, it should be noted that the thermal oxide film 43 is formed with a thickness of 4 nm and the antenna ratio is set to 1,000,000.

Referring to FIG. 18, it can be seen that the yield of the plasma-processing is improved from 40% to 100%, when the high-frequency power to the upper electrode 21 and the low-frequency bias to the lower electrode 4 are interrupted simultaneously at the time of terminating the plasma processing, by supplying the low-frequency bias first to the lower electrode 4 rather than supplying the high-frequency power to the upper electrode 21 first. This yield of 100% is further maintained when the plasma processing is terminated in such a manner that the supply of the high-frequency power is interrupted in advance to the interruption of the supply of the low-frequency power to the lower electrode 4.

The result of FIG. 18 further indicates that the yield is degraded from 100% to 80% when the supply of the low-frequency bias to the lower electrode 4 is interrupted first at the time of terminating the plasma processing. This observation of FIG. 18 indicates that the electric current associated with the non-uniform charge-up of the substrate causes the short circuit in the device elements EL also at the time of termination of the plasma processing as the plasma undergoes shrinking and collapsing, as long as the surface of the substrate is not covered with the ion-sheath. It is therefore preferable to interrupt the supply of the high-frequency power to the upper electrode 21 in advance of interrupting the supply of the low-frequency bias to the lower electrode 4.

Further, it should be noted that the foregoing sequence control of the plasma processing apparatus is not only limited to a plasma etching apparatus but also applicable to a plasma CVD apparatus.

Further, the present invention is not limited to the embodiments described heretofore, but various variations and modifications may be made without departing from the scope of the invention.

What is claimed is:

1. A plasma processing method conducted in a plasma processing apparatus having a processing chamber, an electrode provided in said processing chamber for supporting a substrate thereon, and a plasma generator provided in said processing chamber, said method comprising:

supplying a first electric power of a first frequency to said electrode such that said first electric power does not start a plasma in said processing chamber; and supplying a second electric power of a second frequency to said plasma generator such that said second electric power causes said plasma generator to start the plasma in said processing chamber, wherein said supplying of said first electric power is conducted such that said first electric power is supplied to said electrode prior to said start of said plasma by said plasma generator.

2. A plasma processing method as claimed in claim 1, wherein said supplying of said first electric power is conducted such that said first electric power is supplied to said electrode prior to said start of said plasma by said supplying of said second electric power to said plasma generator, with a magnitude sufficient to form an ion-sheath on a surface of said electrode.

3. A plasma processing method as claimed in claim 1, wherein said supplying of said first electric power is started in advance of said supplying of said second electric power.

4. A plasma processing method as claimed in claim 1, wherein said supplying of said first electric power is started in substantially simultaneously with said supplying of said second electric power.

5. A plasma processing method as claimed in claim 1, wherein said supplying of said first electric power is started later than said supplying of said second electric power.

6. A plasma processing method as claimed in claim 1, wherein said first frequency is lower than about 13.56 MHz.

7. A plasma processing method as claimed in claim 1, wherein said first frequency is lower than about 2 MHz.

8. A plasma processing method as claimed in claim 1, wherein said first frequency is about 800 kHz.

9. A plasma processing method as claimed in claim 1, wherein said second frequency is about 60 MHz.

10. A plasma processing method as claimed in claim 1, wherein said second frequency is about 27 MHz.

11. A plasma processing method as claimed in claim 1, further comprising:

interrupting a supply of said second electric power to said plasma generator; and interrupting a supply of said first electric power to said electrode, said interrupting of said first and second electric powers being conducted substantially simultaneously.

12. A plasma processing method as claimed in claim 1, further comprising:

interrupting a supply of said second electric power to said plasma generator; and interrupting a supply of said first electric power to said electrode, said interrupting of said second electric power being conducted in advance to said interrupting of said first electric power.

13. A plasma processing method conducted in a plasma processing apparatus having a processing chamber, an electrode provided in said processing chamber for supporting a substrate thereon, and a plasma generator provided in said processing chamber, said method comprising:

supplying an a.c. power to said electrode such that said a.c. power does not start a plasma in said processing chamber; and supplying a microwave power to said plasma generator such that said microwave power causes said plasma generator to start the plasma in said processing chamber, wherein said supplying of said a.c. power is conducted such that said a.c. power is supplied to said electrode prior to starting of said plasma by said plasma generator.

14. A plasma processing method as claimed in claim 13, wherein said supplying of said a.c. power is conducted such that said a.c. power is supplied to said electrode prior to starting of said plasma by said plasma generator with a magnitude sufficient to form an ion-sheath on a surface of said electrode.

15. A plasma processing apparatus, comprising:

a processing chamber;

a first electrode provided in said processing chamber supporting a substrate thereon in said processing chamber;

a second electrode provided in said processing chamber so as to face said first electrode;

a first power source supplying a first electric power of a first frequency to said first electrode such that said first electric power does not cause said first electrode to start a plasma in said processing chamber; and a second power source supplying a second electric power of a second, higher frequency to said second electrode such that said second electric power causes said second electrode to start the plasma in said processing chamber, said first power source supplying said first electric power to said first electrode prior to starting of said plasma at said second electrode in response to supplying of said second electric power from said second power source.

16. A plasma processing method conducted in a plasma processing apparatus having a processing chamber, an electrode provided in said processing chamber for carrying a substrate thereon and a plasma generator provided in said processing chamber, said method comprising the steps of:

(A) supplying a first electric power of a first frequency to said electrode;

(B) supplying a second electric power of a second frequency to said plasma generator such that said second electric power causes said plasma generator to start a plasma;

(C) turning off a supply of said second electric power to said plasma generator; and (D) turning off a supply of said first electric power to said electrode, wherein said step (C) is conducted no later than said step (D).

* * * * *